（12） United States Patent
Shah et al.

(10) Patent No.: US 10,671,110 B2
(45) Date of Patent: *Jun. 2, 2020

(54) POWER SERIES TRUNCATION USING CONSTANT TABLES FOR FUNCTION INTERPOLATION IN TRANSCENDENTAL FUNCTIONS

(71) Applicant: INTERNATIONAL BUSINESS MACHINES CORPORATION, Armonk, NY (US)

(72) Inventors: Swapnil Shah, Austin, TX (US); Srinivasan Ramani, Cary, NC (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/560,245

(22) Filed: Sep. 4, 2019

(65) Prior Publication Data

US 2019/0391610 A1 Dec. 26, 2019

Related U.S. Application Data

(63) Continuation of application No. 16/382,181, filed on Apr. 11, 2019, which is a continuation of application
(Continued)

(51) Int. Cl.
*G06F 1/03* (2006.01)
*G06F 1/035* (2006.01)
(Continued)

(52) U.S. Cl.
CPC ............ *G06F 1/0314* (2013.01); *G06F 1/035* (2013.01); *G06F 7/4833* (2013.01); *G06F 7/544* (2013.01);
(Continued)

(58) Field of Classification Search
None
See application file for complete search history.

(56) References Cited

U.S. PATENT DOCUMENTS 5,197,024 A 3/1993 Pickett
5,224,064 A 6/1993 Henry et al.
(Continued)

OTHER PUBLICATIONS

Walters III, E.G. "Linear and quadratic interpolators using truncated matrix multipliers and squarers", Computers, Aug. 21, 2015, 4(4), pp. 293-321, 29 pages.
(Continued)

*Primary Examiner* — Michael D. Yaary
(74) *Attorney, Agent, or Firm* — Bryan Bortnick; Amy J. Pattillo

(57) ABSTRACT

A primary interval for convergence of at least one power series in a transcendental function is interpolated, while selecting a number of one or more interpolation points for a truncated expansion of the at least one power series by a selected order of truncation. A function and at least one derivative of the function of the truncated expansion of the selected order of truncation is evaluated at the one or more interpolation points. Each separate value evaluated for the function and each of the at least one derivative is saved in a table, wherein the table is looked up for efficiently computing a result of the truncated expansion of the at least one power series.

18 Claims, 8 Drawing Sheets

Related U.S. Application Data

No. 15/595,676, filed on May 15, 2017, now Pat. No. 10,331,162.

(51) Int. Cl.
| | |
|---|---|
| *H03K 19/17728* | (2020.01) |
| *G06F 7/483* | (2006.01) |
| *G06F 7/544* | (2006.01) |
| *G06F 7/48* | (2006.01) |
| *G06F 7/42* | (2006.01) |

(52) U.S. Cl.
CPC ......... *H03K 19/17728* (2013.01); *G06F 7/42* (2013.01); *G06F 7/48* (2013.01)

(56) References Cited

U.S. PATENT DOCUMENTS

| | | | |
|---|---|---|---|
| 6,363,405 | B1 | 3/2002 | Loginov |
| 9,015,217 | B2* | 4/2015 | Arnold ............... G06F 7/544 708/235 |
| 10,331,162 | B2 | 6/2019 | Shah et al. |
| 2014/0222883 | A1 | 8/2014 | Pineiro et al. |
| 2017/0323042 | A1 | 11/2017 | Zhang et al. |
| 2018/0329447 | A1 | 11/2018 | Shah et al. |
| 2019/0235564 | A1 | 8/2019 | Shah et al. |

OTHER PUBLICATIONS

Sadeghian, M., Stine, J. E., & Walters, E. G., "Optimized Linear, Quadratic and Cubic Interpolators for Elementary Function Hardware Implementations", Electronics, Dec. 30, 2015, 5(2), 25 pages.

Johansson, F., "Fast and rigorous computation of special functions to high precision", Doctoral dissertation, PhD thesis, RSC Institute, Linz, Austria, Feb. 2014, 121 pages.

Johansson, F., "Arb: Efficient Arbitrary-Precision Midpoint-Radius Interval Arithmetic", arXiv preprint arXiv:1611.02831, Nov. 9, 2016, 12 pages.

Forbes, G.W., "Truncation and manipulation of multivariate power series", Journal of Computational and Applied Mathematics, 1986, pp. 27-36, 10 pages.

Tanguay, M. et al, "An efficient optimum interpolation analysis scheme", Atmosphere-ocean, 28:3, 365-377, 1990, 14 pages.

Suresh et al, "Intercepting Functions for Memoization: A Case Study Using Transcendental Functions", ACM Transactions on Architecture and Code Optimization (TACO), ACM 2015, 12(2), 24 pages.

Conte et al., "Numerical Analysis II", Elementary Numerical Analysis: An Algorithmic Approach, 1981, 55 pages.

"Power Series Expansions", accessed online via the Internet from <http://www.mathcs.emory.edu/~fox/NewCCS/ModuleIV/ModIVP8.html> as of Apr. 17, 2017, last modified Oct. 17, 2001, 7 pages.

"Worksheet 1: Truncated Power Series", accessed online via the Internet from <http://cims.nyu.edu/~donev/Teaching/PHY201/worksheet2tex/node1.html> as of Apr. 17, 2017, last modified Dec. 12, 2000, 4 pages.

Non-final Office Action, dated Aug. 23, 2018, U.S. Appl. No. 15/595,676, filed May 15, 2017, In re Shah, 15 pages.

Notice of Allowance, dated Feb. 13, 2019, U.S. Appl. No. 15/595,676, filed May 15, 2017, In re Shah, 7 pages.

"List of IBM Patents or Patent Applications Treated as Related", dated Sep. 4, 2019, 2 pages.

Non-final Office Action, dated Jul. 30, 2019, U.S. Appl. No. 16/382,181, filed Apr. 11, 2019, In re Shah, 12 pages.

Notice of Allowance, dated Aug. 2, 2019, U.S. Appl. No. 16/382,181, filed Apr. 11, 2019, In re Shah, 8 pages.

\* cited by examiner

CONSTANT TABLE WITH 'M' = 2 410

| index | f_x | f_x1 |
|---|---|---|
| 0 | 0xbffb172180e113c0 | 0x4000000000e133c0 |
| 1 | 0xbffb16a17c3844d7 | 0x3fffff000070862a |
| 2 | 0xbffb16217de4e448 | 0x3ffffe001bc80c10 |
| 3 | 0xbffb15a18f27193f | 0x3ffffd0046479bc8 |
| 4 | 0xbffb15219dbf22ac | 0x3ffffc007b6ed77e |
| 5 | 0xbffb14a1abed1b4e | 0x3ffffb00bfbc4132 |
| | /......../ | |
| 16383 | 0xbfe306c360567822 | 0x3fe5558e39b4e9f9 |

CONSTANT TABLE WITH 'M' = 3 412

| index | f_x | f_x1 | f_x2 |
|---|---|---|---|
| 0 | 0xbff7173283e6a74c | 0x3ff000000dd875b0 | 0x3feffffe7d363a0 |
| 1 | 0xbff714a1a1806de5 | 0x3feff80114e447ef | 0x3feffc0061ed2968 |
| 2 | 0xbff712220290bcfe | 0x3feff0041693718e | 0x3feff801e4e12c35 |
| 3 | 0xbff70fa2a20ea123 | 0x3fefe80912945dfa | 0x3feff40462e39548 |
| 4 | 0xbff70d23836003f2 | 0x3fefe0101132d445 | 0x3feff007e4a2a863 |
| 5 | 0xbff70aa49fcde15b | 0x3fefd818ffd7a793 | 0x3fefec0c57dd4734 |
| | /......../ | | |
| 4095 | 0x3fc3dcf282d7ca9a | 0xbfd5538e43dacbb8 | 0x3fd55638f6e0d85f |

*FIG. 4*

TABLE LOOKUP AND COMPUTATION 124

INDEX SELECTOR 502

RESULT CALCULATION 504

```
typedef  union u {                                          510
         double t;
         long l;
} lo_dbl;

static double table_comp(float x)
{
         lo_dbl tmp;
         long index;
         double res;

tmp.t = x + 511.5;                    ] INDEX SELECTOR
         index = (tmp.l >> 29) & 0x7fffff;

res = logf_tbl.d[2*index] + x * logf_tbl.d[2*index+1];
         return res;
}|                                              RESULT CALCULATION
```

FIG. 5

POWER SERIES TRUNCATION USING
CONSTANT TABLES FOR FUNCTION
INTERPOLATION IN TRANSCENDENTAL
FUNCTIONS

CROSS REFERENCE TO RELATED
APPLICATIONS

This application is a continuation of commonly assigned U.S. patent application Ser. No. 16/382,181, filed Apr. 11, 2019, which is a continuation of U.S. patent application Ser. No. 15/595,676, filed May 15, 2017, which are hereby incorporated herein by reference.

BACKGROUND

1. Technical Field

One or more embodiments of the invention relate generally to microprocessors and particularly to efficiently computing transcendental functions.

2. Description of the Related Art

Non-arithmetic functions, including transcendental functions, are generally more computationally intensive than arithmetic functions. In running scientific benchmarks on computer systems to assess performance, a significant percentage of the execution time is generally spent evaluating transcendental math functions. The complexity of transcendental functions requires replacing a transcendental function with a simpler function for computation. For example, transcendental functions are generally simplified with a primary execution path of one or more power series expansions, which each require multiple cycles to execute.

BRIEF SUMMARY

In one embodiment, a method is directed to interpolating, by a computer, a primary interval for convergence of at least one power series in a transcendental function while selecting a number of one or more interpolation points for a truncated expansion of the at least one power series by a selected order of truncation. The method is directed to evaluating, by the computer, a function and at least one derivative of the function of the truncated expansion of the selected order of truncation at the one or more interpolation points. The method is directed to comparing, by the computer, a first unit of last precision value of each separate value evaluated for the function and the at least one derivative at each of the one or more interpolation points. The method is directed to, responsive to the first unit of last precision value being less than an error bounds: decreasing, by the computer, the number of the at one or more interpolations points; and reevaluating, by the computer, the function and the at least one derivative of the function of the truncated expansion of the selected order of truncation at the adjusted number of each of the one or more interpolation points. The method is directed to responsive to the first unit of last precision value not being less than the error bounds: increasing, by the computer, the number of the at one or more interpolations points; reevaluating, by the computer, the function and the at least one derivative of the function of the truncated expansion of the selected order of truncation at the adjusted number of each of the one or more interpolation points; and comparing, by the computer, a second unit of last precision value of each separate value evaluated for the function and the at least one derivative at each of the one or more interpolation points for the reevaluated function. The method is directed to, responsive to the second unit of last precision being greater than the error bounds: increasing, by the computer, the number of the at one or more interpolations points; reevaluating, by the computer, the function and the at least one derivative of the function of the truncated expansion of the selected order of truncation at the adjusted number of each of the one or more interpolation points; and comparing, by the computer, a second unit of last precision value of each separate value evaluated for the function and the at least one derivative at each of the one or more interpolation points for the reevaluated function. The method is directed to, responsive to the second unit of last precision not being greater than the error bound, determining, by the computer, whether a cache effect of a size of each separate value evaluated for the function and each of the least one derivative in the table. The method is directed to, responsive to the cache effect being acceptable, saving, by the computer, each separate value evaluated for the function and each of the at least one derivative in a table in a cache, wherein the table is looked up for efficiently computing a result of the truncated expansion of the at least one power series. The method is directed to, responsive to the cache effect not being acceptable, increasing, by the computer, the selected order of truncation and estimating the number of one or more interpolation points to converge within the primary interval for the order of truncation at a specified number of fraction bits of precision.

In another embodiment, a computer system comprises one or more processors coupled to one or more memories. The computer system comprises the processor operative to interpolate a primary interval for convergence of at least one power series in a transcendental function while selecting a number of one or more interpolation points for a truncated expansion of the at least one power series by a selected order of truncation. The computer system comprises the processor operative to evaluate a function and at least one derivative of the function of the truncated expansion of the selected order of truncation at the one or more interpolation points. The computer system comprises the processor operative to compare a first unit of last precision value of each separate value evaluated for the function and the at least one derivative at each of the one or more interpolation points. The computer system comprises the processor operative to, responsive to the first unit of last precision value being less than an error bounds: decrease the number of the at one or more interpolations points; and reevaluate the function and the at least one derivative of the function of the truncated expansion of the selected order of truncation at the adjusted number of each of the one or more interpolation points. The computer system comprises the processor operative to, responsive to the first unit of last precision value not being less than the error bounds: increase the number of the at one or more interpolations points; reevaluate the function and the at least one derivative of the function of the truncated expansion of the selected order of truncation at the adjusted number of each of the one or more interpolation points; and compare a second unit of last precision value of each separate value evaluated for the function and the at least one derivative at each of the one or more interpolation points for the reevaluated function. The computer system comprises the processor operative to, responsive to the second unit of last precision being greater than the error bounds: increase the number of the at one or more interpolations points; reevaluate the function and the at least one derivative of the function of the truncated expansion of the selected order of truncation at the adjusted number of each of the one or more interpolation points; and compare a second unit of last precision value of each separate value evaluated for the function and the at least one derivative at each of the one or more interpolation points for the reevaluated function. The computer system comprises the processor operative to, responsive to the second unit of last precision not being greater than the error bound, determine whether a cache effect of a size of each separate value evaluated for the function and each of the least one derivative in the table. The computer system comprises the processor operative to, responsive to the cache effect being acceptable, save each separate value evaluated for the function and each of the at least one derivative in a table in a cache, wherein the table is looked up for efficiently computing a result of the truncated expansion of the at least one power series. The computer system comprises the processor operative to, responsive to the cache effect not being acceptable, increase the selected order of truncation and estimating the number of one or more interpolation points to converge within the primary interval for the order of truncation at a specified number of fraction bits of precision.

In another embodiment, a computer program product comprises a computer readable storage medium having program instructions embodied therewith, wherein the computer readable storage medium is not a transitory signal per se. The program instructions are executable by a computer to cause the computer to interpolate a primary interval for convergence of at least one power series in a transcendental function while selecting a number of one or more interpolation points for a truncated expansion of the at least one power series by a selected order of truncation. The program instructions are executable by the computer to cause the computer to evaluate a function and at least one derivative of the function of the truncated expansion of the selected order of truncation at the one or more interpolation points. The program instructions are executable by the computer to cause the computer to compare a first unit of last precision value of each separate value evaluated for the function and the at least one derivative at each of the one or more interpolation points. The program instructions are executable by the computer to cause the computer to, responsive to the first unit of last precision value being less than an error bounds: decrease the number of the at one or more interpolations points; and reevaluate the function and the at least one derivative of the function of the truncated expansion of the selected order of truncation at the adjusted number of each of the one or more interpolation points. The program instructions are executable by the computer to cause the computer to, responsive to the first unit of last precision value not being less than the error bounds: increase the number of the at one or more interpolations points; reevaluate the function and the at least one derivative of the function of the truncated expansion of the selected order of truncation at the adjusted number of each of the one or more interpolation points; and compare a second unit of last precision value of each separate value evaluated for the function and the at least one derivative at each of the one or more interpolation points for the reevaluated function. The program instructions are executable by the computer to cause the computer to, responsive to the second unit of last precision being greater than the error bounds: increase the number of the at one or more interpolations points; reevaluate the function and the at least one derivative of the function of the truncated expansion of the selected order of truncation at the adjusted number of each of the one or more interpolation points; and compare a second unit of last precision value of each separate value evaluated for the function and the at least one derivative at each of the one or more interpolation points for the reevaluated function. The program instructions are executable by the computer to cause the computer to, responsive to the second unit of last precision not being greater than the error bound, determine whether a cache effect of a size of each separate value evaluated for the function and each of the least one derivative in the table. The program instructions are executable by the computer to cause the computer to, responsive to the cache effect being acceptable, save each separate value evaluated for the function and each of the at least one derivative in a table in a cache, wherein the table is looked up for efficiently computing a result of the truncated expansion of the at least one power series. The program instructions are executable by the computer to cause the computer to, responsive to the cache effect not being acceptable, increase the selected order of truncation and estimating the number of one or more interpolation points to converge within the primary interval for the order of truncation at a specified number of fraction bits of precision.

BRIEF DESCRIPTION OF THE SEVERAL VIEWS OF THE DRAWINGS

The novel features believed characteristic of one or more embodiments of the invention are set forth in the appended claims. The one or more embodiments of the invention itself however, will best be understood by reference to the following detailed description of an illustrative embodiment when read in conjunction with the accompanying drawings, wherein:

FIG. 4 illustrates one example of values of interpolation point constants of a truncated power series expansion, pre-computed in a constant table that may be looked up from cache;

FIG. 5 illustrates one example of one or more functions of table lookup and computation for looking up pre-computed constant values for interpolation points of a power series expansion from a constant table and computing a result from the constant values, for efficient computation of a transcendental function with a convergent power series expansion;

DETAILED DESCRIPTION

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

In addition, in the following description, for purposes of explanation, numerous systems are described. It is important to note, and it will be apparent to one skilled in the art, that the present invention may execute in a variety of systems, including a variety of computer systems and electronic devices operating any number of different types of operating systems.

Figure 1:
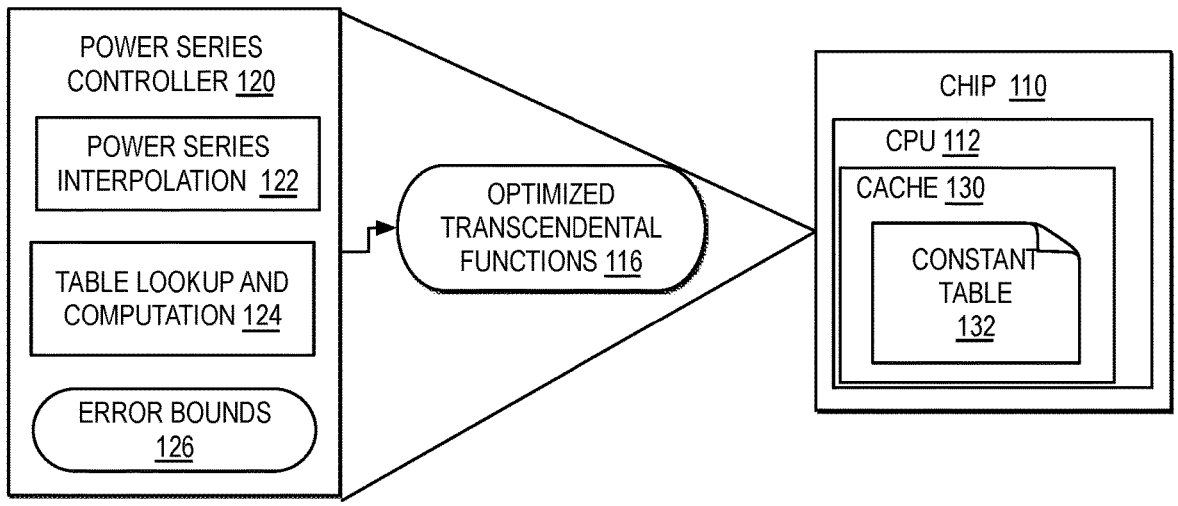
FIG. 1 illustrates one example of a block diagram of a power series controller for managing multiples types of functions on a chip, including efficiently computing transcendental functions by combining scaling and truncation of one or more convergent power series expansions with generation of a constant table that can be looked up for computing the one or more truncated power series expansions.

FIG. 1 illustrates one example of a block diagram of a power series controller for managing multiples types of functions on a chip, including efficiently computing transcendental functions by combining scaling and truncation of one or more convergent power series expansions with generation of a constant table that can be looked up for computing the one or more truncated power series expansions.

In one example, a chip 110 represents one or more microprocessors and other integrated circuits. In one example, chip 110 may include one or more controllers, processing units, memories, and other infrastructure for performing general purposes operations and specified for performance specific types of operations. For example, chip 110 may include one or more central processing units, such as CPU 112, each with one or more cache residing with the CPU or accessible to the CPU on chip 110, such as cache 130. In additional or alternate examples, chip 110 may include additional or alternate configurations with additional or alternate CPUs and cache.

In one example, chip 110 may process multiple types of mathematical functions, such as, but not limited to, arithmetic functions and transcendental functions. In one example, arithmetic functions may include, but are not limited to, subtraction, multiplication, division, and comparison. In one example, transcendental functions may represent more complex mathematical functions including, but not limited to, exponential function, sine, cosine, logarithm, arctangent, error function, and Bessel functions.

In one example, transcendental functions may be characterized as complicated functions that in practice are computed by chip 110 by replacing complicated functions with simpler mathematical functions, such as one or more convergent power series expansions, and approximating results using the convergent power series expansions. In one example, a power series controller 120 may manage the replacement and optimization of transcendental functions with convergent power series expansions that approximate the results of the transcendental function. In one example, power series controller 120 may represent one or more, or a combination of one or more, of hardware integrated onto chip 110, firmware implemented in CPU 112 or another unit of chip 110, and software of an operating system, compiler, or application executing on CPU 112.

In one example, power series controller 120 may manage replacement of a call to a transcendental function with a power series expansion by specifying or performing one or more types of functions including, but not limited to, operations for scaling or range reduction and operations for power series expansion. In one example, the scaling or range reduction operations may include, but are not limited to, scaling or range reduction of the points to be evaluated to ensure that a power series converges for an entire range of values supported by a primary execution path of the transcendental function. In one example, the power series expansion operations may include, but are not limited to, interpolation of an original power series expansion with an infinite order, to a truncated power series with a limited order in the power series. In one example, a truncated power expansion may include a primary function and a selected number of derivative functions, with the combined number of functions set to the order of the power series.

In one example, even though power series controller 120 replaces complicated functions with simpler mathematical functions, the scaling or range reduction and interpolation of transcendental functions to manage power series expansions may still utilize a significant amount of computations, and have high operational cost per operation on chip 110, because of the repetitions that may be required when estimating a transcendental function. In practice, when running scientific benchmarks on chip 110, transcendental functions may consume a significant percentage of execution time if the operations for managing power series expansions are also computationally intensive, expensive operations. There is a need to minimize the latency from the operations required by power series controller 120, and in particular, the operations required to scale or range reduce and interpolate power series expansions of transcendental functions.

In particular, in one example, the latency from operations required by power series controller 120 may increase if the operations selected for scaling or reduction and for interpolation also utilize computations that are operationally expensive in terms of the cost of operation on chip 110, including, but not limited to, bus time, CPU processing time, and cache usage. For example, addition, subtraction and comparison operations are less operationally expensive, however multiplication operations are more operationally expensive. For example, a multiplication operation may have four times the cost of operation on CPU 112 as an addition operation, however, a sequence of fused multiply adds may have an even higher cost than one multiplication operation. A division operation, for example, may have 10 times the cost of operation on CPU 112 as an addition operation, and floating point divides may be even more operationally expensive.

In one example, to manage replacement of a call to a particular transcendental function, power series controller 120, when functioning as a compiler, may access a source code library including operations for managing the scaling or range reduction and power series expansion of a particular type of transcendental function, however, if the operations included in the source library require fused multiple adds and floating point divides, there may be a significant cost of operation on CPU 112. For example, the GNU C library single precision log implementation (log f) is an example of a source code library that may be called by a C compiler for handling the log f transcendental function, however, the operations of the source code library have a significant cost of operation:

```
__ieee754_logf(floatx)
{
        /* Primary execution path */
        /.../
        f = x-(float)1.0;
        /.../
        s = f/((float)2.0+f);
        /.../
        z = s*s;
        w = z*z;
        /.../
        t1 = w*(Lg2+w*(Lg4+w*Lg6));
        t2 = z*(Lg1+w*(Lg3+w*(Lg5+w*Lg7)));
        /.../
        R = t2+t1;
        /.../
}
```

In the example source code, the steps of "f=x−(float)1.0", "s=f/((float)2.0+f)", "z=s*s", and "w=z*z" are examples of operations performed for scaling to ensure the power series converges for the entire range of values supported by the primary execution path, however, these steps include multiple floating point divide operations, which have a high cost of operation on CPU 112. In addition, in the example, the steps of "t1=w*(Lg2+w*(Lg4+w*Lg6))" and "t2=z*(Lg1+w*(Lg3+w*(Lg5+w*Lg7)))" are examples of operations performed for power series expansion, however, these steps include fused multiply add operations, which have a high cost of operation on CPU 112. In the example, the operations required for the floating point divides and the fused multiply add operations also form a tight dependency chain, resulting in a cumulative latency that cannot be hidden, even if exploiting instruction-level parallelism (ILP) options for CPU 112 and even with large instruction window sizes in an out-of-order execution available in CPU 112.

According to one embodiment of the present invention, power series controller 120 may implement steps that optimize the operations required for executing transcendental functions, as optimized transcendental function 116, which when executed on chip 110, perform better than transcendental functions interpolated by the standard GNU C libraries by significant amounts. Power series controller 120 minimizes the latency of transcendental functions by combining scaling or range reduction steps with truncated power series expansion through power series interpolation 122, where power series interpolation 122 significantly reduces the number of floating point operations required for computing a transcendental function by computing constant tables, such as constant table 132. A table lookup and computation 124 of power series controller 120 may use the pre-computed values in constant table 132, looked up in cache 130, for efficiently computing truncated power series expansions. In one example, power series interpolation 122 may combine scaling or range reduction with interpolation to generate the truncated power series expansion, before generation of constant table 132, to significant improve performance of transcendental functions on chip 110 over steps that separately perform scaling and power series expansion using floating point divides and fused multiply adds as shown in the standard GNU C library for a logarithm function.

In addition, according to one embodiment of the present invention, power series controller 120 may further reduce execution time of the function paths for transcendental functions replaced by truncated power series expansions by allowing table lookup and computation 124 to compute a truncated power expansion using pre-computed values looked up from constant table 132.

Power series controller 120 may apply power series interpolation 122 and table lookup and computation 124 to any transcendental function bearing a convergent power series, independent of any specific characteristics of the transcendental function, in contrast to other tabulation methods that only exploit characteristics of a particular transcendental function and are not application to any transcendental function bearing a convergent power series. For example, while the GNU C library may include source code for individual transcendental functions bearing a convergent power series that also include a table lookup, such as the exp f source code and the sin f/cos f source code, each of the exp f source code and sin f/cos f source code is specified to exploit a particular characteristic of that function and is not generally applicable to any transcendental functions bearing a convergent power series In one example of a function specific GNU C library source code for the exp f function, in the GNU C library, Glibc 2.24, for the exp f function with the identity exp $(a)=2^{a/ln(2)}$, the GNU C library may exploit a special characteristic of the exp f function of $2^{(a+b)}=2^{(a)}*2^{(b)}$, by separating 'a/ln(2)' into an integer part 'n', a fraction part 'f' and a residue 'x', and then using the special characteristic of $2^{(a+b)}=2^{(a)}*2^{(b)}$, the GNU C library evaluates the final result as the product of exponentials of all three parts 'n', T, and 'x'. For the exp f function only, the GNU C library may implement a table lookup function to find the exponential of the fraction which is the largest fraction of the number of table entries smaller than the exact fractional part of 'a/ln (2)', and the exponential of residue 'x' may be evaluated using a power series which converges fast as the residue is very small. In the example of the exp f function, the table lookup function for 'f' is based on the $2^{(a+b)}=2^{(a)}*2^{(b)}$ characteristic, which no other function has, and is therefore limited to the exp f function only. In contrast, power series controller 120 generally applies power series interpolation 122 and table lookup and computation 124 to any transcendental function bearing a convergent power series and power series interpolation 122 does not take into consideration the characteristic properties of each underlying function for truncation of the power series expansion, allowing power series interpolation 122 to be applicable to all functions with a convergent power series.

In one example of a function specific GNU C library source code for the sin f/cos f function, in the GNU C library, Glibc 2.24, an x86_64 assembly implementation of sin f/cos f may exploit the periodicity of trigonometric functions and the following:

$$\sin\left(\frac{\pi}{2} - x\right) = \cos(x); \sin(\pi - x) = \sin(x); \sin(-x) = -\sin(x).$$

In one example, the input argument for the sin f/cos f function may be brought into the primary interval of $$\left[0, \frac{\pi}{4}\right]$$

of either the sine or the cosine function. In one example, the primary interval may be an effective range reduction for evaluation of the trigonometric function. Next, in the assembly implementation a Chebyshev polynomial that converges for this interval is implemented. In the assembly implementation, a table lookup may be employed to find the appropriate constant to be subtracted from the input argument to bring it to the primary interval, from the range reduction, however, the table lookup is not use for power series truncation. In contrast, power series interpolation 122 is applied to generate a constant table to truncate an existing power series expansion to a lower order for any transcendental function with a convergent power series independent of any particular characteristic of the transcendental function, wherein table lookup and computation 124 may lookup constant table 132 to retrieve interpolated function values and derivative values to calculate a result. In addition, in contrast to the assembly implementation, power series interpolation 122 applies above the GNU C library source code range reduction using a lookup table because power series interpolation 122 truncates the order of the Chebyshev polynomial used to evaluate the trigonometric function in the primary interval and generates a table for the truncated Chebyshev polynomial to be looked up for computing the result of the function.

In one example, in generating constant table 132, power series interpolation 122 dynamically selects the number of points saved in constant table 132, and the size of the table, to make sure constant table 132 will fit in cache 130, to minimize any cache miss latency. In dynamically selecting the number of points saved in constant table 132, power series interpolation 122 also selects the number of points and the number of derivatives to bring the unit of last precision (ULP) error of the points of the power series evaluation within an error bounds 126. In one example, error bounds 126 is configurable to a ULP value. In another example, error bounds 126 is set to a default ULP value, such as 1 ULP.

In one example, while the function return values computed by table lookup and computation 124 may also be indexed and cached used for efficiently computing repeating arguments, which may be referred to as memoization, caching the return values of a transcendental function does not perform the power series truncation of power series interpolation 122 and there is not a guarantee of repeated arguments requiring access to the same cached values for any given workload, which introduces cache misses and diminishes any benefit achieved by using a table lookup of the function return values. In the present invention, power series interpolation 122 truncates the power series expansion when generating the constants for constant table 132, where the constants in constant table 132 may be reused for the truncated power series expansion across a workload. The power series truncation, constant table generation, and table lookup of power series controller 120 provides for caching truncated function values pre-result computation for table lookup, while also generating a constant table that fits within cache, to avoid the high number of cache misses likely with memoization and also to avoid the latency of direct evaluation of the power series on the fly.

Figure 2:
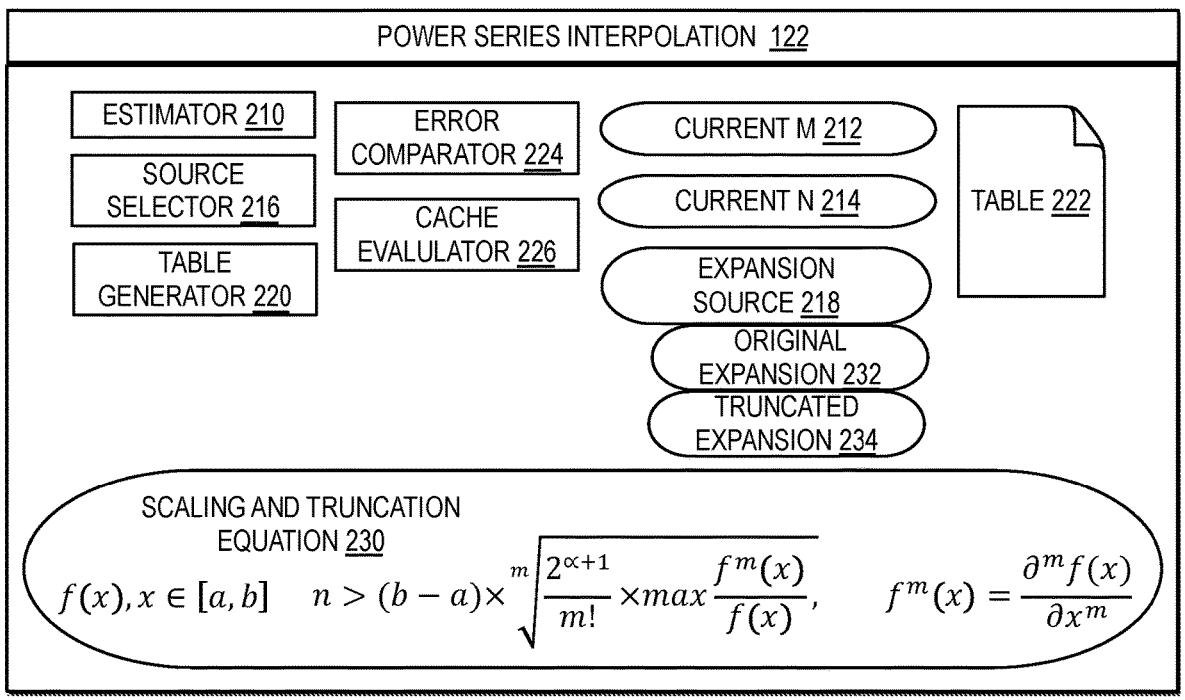
FIG. 2 illustrates one example of a block diagram of functional components of power series interpolation for generating a constant table optimized for a power series expansion replaced by a truncated power series expansion, where the constant table can be looked up for executing the truncated power series expansion.

FIG. 2 illustrates one example of a block diagram of functional components of power series interpolation for generating a constant table optimized for a power series expansion replaced by a truncated power series expansion, where the constant table can be looked up for executing the truncated power series expansion.

In one example, power series interpolation 122 may represent one or a combination of one or more of hardware elements, firmware, and software components. In one example, power series interpolation 122 may include multiple software layers, such as, but not limited to, an operating system layer, a compiler, and one or more libraries. Generally, power series interpolation 122 interpolates the primary interval of a power series expansion with a truncated power series expansion, evaluates the truncated function and its derivatives at a selection of interpolation points, and saves a table with the pre-computed values which can be looked up by table lookup and computation 124 for the now truncated power series expansion. In one embodiment of the present invention, these functions may be performed by one or more of the components of power series interpolation 122 including, but not limited to, estimator 210, source selector 216, table generator 220, error comparator 224, and cache evaluator 226. In additional or alternate embodiments, power series interpolation 122 may include additional or alternate components.

In one example, estimator 210 of power series interpolation 122 may initially evaluate a transcendental function 'f(x)', with a primary interval for convergence of the power series of '[a,b]', as illustrated in scaling and truncation equation 230. In one example, 'n' is the estimate of the number of points required for the order of truncation 'm'. In one example, '∝' may represent a number of fraction bits in an IEEE representation, for example '∝' is 23 for single precision and 52 for double precision.

In one example, an estimator 210 may initially set a current M 212, for the value of 'm', to '1', where setting 'm' to '1" sets an order of truncation of one derivative in a power series expansion. Estimator 210 may estimate 'n' based on scaling and truncation equation 230, and set current N 214 to the estimated 'n' value. In one example, as illustrated in scaling and truncation equation 230, the estimated 'n' value is estimated based on the setting of 'm', the primary interval for convergence of '[a,b]' to optimize the computational cost of the estimation of 'n' for the transcendental function currently applied. In the example, scaling and truncation equation 230 may be generally applied across multiple types of transcendental functions independent of any particular characteristics of a particular transcendental function.

In one example, source selector 216 may adjust a power series expansion source 218 from an original power series expansion 232, such as the power series expansion in the standard GNU C library, to a truncated power series expansion 234 that is truncated to a number of derivatives specified in current M 212, for the current N 214 value of interpolation points to be pre-computed in table 222. Table generator 220 generates a table 222 for the 'm' value in current M 212 and the 'n' value in current N 214.

Error comparator 224 calculates and compares a current ULP error for table 222 with error bounds 126 and selects whether to increase or decrease 'n' to optimize the number of interpolation points required to bring the interpolation points closer and meet error requirements of error bounds 126. As error comparator 224 increases or decreases 'n' in current N 214, error compactor 224 triggers table generator 220 to update table 222 for the 'm' value in current M 212 and the 'n' value in current N 214 and continues to check the ULP error for table 222 against error bounds 126.

For example, error comparator 224 may determine whether the ULP error in the spacing between values in table 222 is greater than error bounds 126, such as 1 ULP. In one example, if error comparator 224 detects that the ULP error is less than error bounds 126, error comparator 224 may decrease the value of 'n' in current N 214 and trigger table generator 220 to update table 222 for the 'm' value in current M 212 and the decreased 'n' value in current N 214. Error comparator 224 may check whether the ULP error in updated table 222 is less than error bounds 126, and if the ULP error is less than the bounds, continue to recursively decrease the value of 'n' in current N 214 and trigger table generator 220 to update table 222.

For example, if error comparator 224 detects that the ULP error is not less than error bounds 126, then error comparator 224 may increase the value of 'n' in current N 214 and triggers table generator 220 to update table 222 for the 'm' value in current M 212 and the increased 'n' value in current N 214. If error comparator 224 detects that the table generated for the increased value of 'n' is not greater than error bounds 126, error comparator 224 may trigger cache evaluator 226.

In one example, cache evaluator 226 evaluates whether the impact of table 222 on cache 130 is acceptable. The size of constant table 132, and the number of interpolation points that may be saved, may be constrained by the amount of memory available within cache 130. If constant table 132 does not fit within cache 130, the cache miss latency may diminish any benefit achieved by truncating the order of the power series.

In one example, if cache evaluator 226 evaluates that cache 130 can hold table 222 locally and the effects on cache 130 are acceptable, cache evaluator 226 saves table 222 as constant table 132. In one example, if cache evaluator 226 evaluates that cache 130 cannot hold table 222 locally or the effects on cache 130 are not acceptable, cache evaluator 226 increases the value of 'm' in current M 212 by '1', triggers estimator 210 to estimate 'n' in scaling and truncation equation 230 for the increased value of 'm' in current M 212, triggers source selector 216 to adjust expansion source 218 to refer to truncated expansion 234 with an additional derivative for the increased value of 'm', triggers table generator 220 to update table 222 for the increased 'm' value in current M 212 and the updated estimate value of 'n' value in current N 214, triggers error comparator 224 to evaluate the ULP error of table 222 against error bounds 126 and adjust the value of 'n' in current N 214, and triggers cache evaluator 226 to evaluate whether the cache effect of the updated table 222 is acceptable.

In one example, estimator 210, source selector 216, table generator 220, error comparator 224, and cache evaluator 226 adjust 'm', 'n', expansion source 218, and table 222 to identify a beneficial tradeoff point between the order of truncation in 'm' of the original power series that is truncated in expansion source 218 versus a size of table 222 that is stored in cache 130 for lookup during the execution of the truncated power series expansion. In one example, to reach a ULP error that is within error bounds 126, the interpolation points calculated in table 222 are brought closer to one another by increasing 'n', which means an increase is the number of points saved in table 222, however, as the interpolation points are brought closer, the number of higher derivatives required to evaluate the truncated power series within error bounds 126 may decrease, therefore as described, in additional or alternate embodiments, error comparator 224 may perform additional or alternate evaluations and adjustments of the value of 'n' in current N 214 and the value of 'm' in current M 212 to efficiently select an order of truncation of 'm' and a number of interpolation points that yield a table that both falls within error bounds 126 and is acceptable within cache 130.

Figure 3:
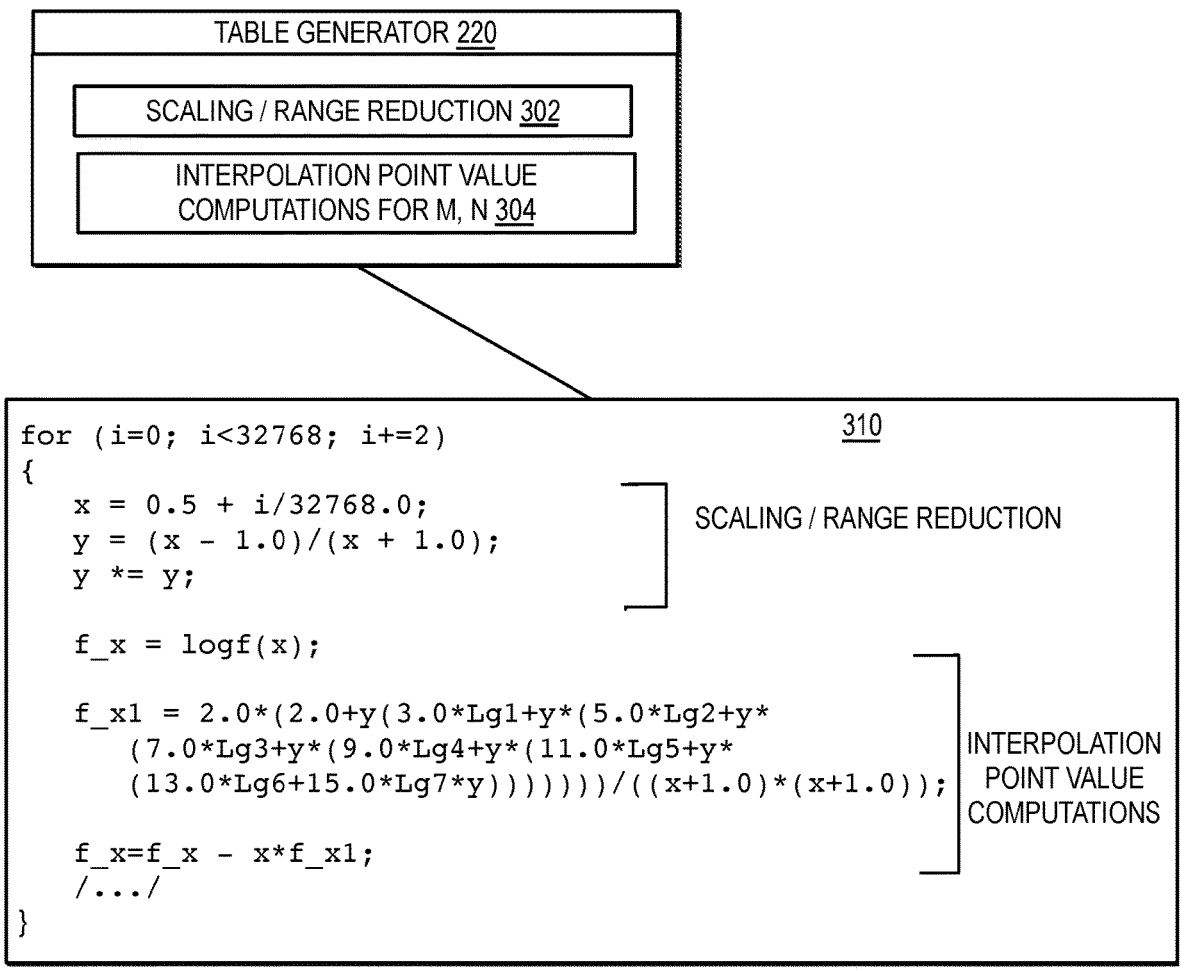
FIG. 3 illustrates one example of one or more functions of a table generator for generating a compute table of interpolation point values for a truncated power series expansion for lookup during execution of the truncated power series expansion.

FIG. 3 illustrates one example of one or more functions of a table generator for generating a compute table of interpolation point values for a truncated power series expansion for lookup during execution of the truncated power series expansion.

In one example, table generator 220 may include one or more functions for scaling/range reduction 302 and one or more functions for interpolation point value computations for M, N 304. In additional or alternate examples, table generator 220 may include additional or alternate functions.

In one example, code 310 illustrates types of functions that may be implemented by table generator 220 for scaling/range reduction 302 to perform the scaling functions originally performed by the GNU C log f single precision log implementation in the GNU C library, without requiring the float divide operations implemented in the GNU C log f single precision log implementation. For example, code 310 includes three statements for setting 'x' and 'y', in a loop body, that perform scaling/range reduction 302 using addition, subtraction, multiplication, and division operations, but not using float divide operations, which use significantly more computational resources than the operations of "x=0.5+i/32768.0", "y=(x−1.0)/(x+1.0)" and "y*=y" illustrated in code 310.

In the example illustrated in code 310, the truncation order of 'm' in current M 212, is set to '2', with 'f_x' as the function under consideration of "log f" and 'f_x1' as the first derivative at the interpolation point. The number of interpolation points calculated in the example of code 310 is "16384", which is "32768/2", to provide two constants per interpolation point at "f_x" and "f_x1". In one example, the value of the truncation order is based on the selection of current M 212 as illustrated in FIG. 2 and the number of interpolation points is based on the selection of current N 214 as illustrated in FIG. 2.

In the example, by running code 310 to pre-compute the values of interpolation points for constant table 132, the latency of processing transcendental functions, such as the log f function illustrated, is minimized by replacing the floating point divide operations applied in the GNU C library at runtime for scaling with simplified, less operationally costly, mathematical operations. In addition, in the example, by running code 310 to pre-compute the values of interpolations points of a truncated power series expansion illustrated for "f_x" and "f_x1", the pre-computed interpolation values are stored in a table in cache for quick lookup using indexes when computing the truncated power series expansion, which minimizes the latency of performing computations when running transcendental functions because the operational expense of repetitively computing multiple constants per interpolation point is performed at one time, during generation of the constant table 132, to be quickly looked up from cache 130 by table lookup and computation 124.

FIG. 4 illustrates one example of values of interpolation point constants of a truncated power series expansion, pre-computed in a constant table that may be looked up from cache.

A first example at reference numeral 410 illustrates an example of a constant table generated by table generator 220 with the order of truncation 'm' set to '2'. In the example, correlating with the operations in code 310, the table includes 16384 index entries, which is equal to "32768/(m=2)" entries, where each index entry represents an interpolation point. In the example, values of two constants are stored with each index with a first value computed for a function 'f_x' at the interpolation point and the second value computed for a first derivative 'f_x1' at the interpolation point.

A second example at reference numeral 412 illustrates an example of a constant table generated by table generator 220 with the order of truncation 'm' set to '3'. In the example, correlating with the operations in code 310, the 'n' is 4096 and the table includes 12288 index entries, where each index entry represents a value at an interpolation point. In the example, values of three constants are stored with each index with a first value computed for a function 'f_x' at the interpolation point, the second value computed for a first derivative 'f_x1' at the interpolation point, and the third value computed for a second derivative 'f_x2' at the interpolation point.

FIG. 5 illustrates one example of one or more functions of table lookup and computation for looking up pre-computed constant values for interpolation points of a power series expansion from a constant table and computing a result from the constant values, for efficient computation of a transcendental function with a convergent power series expansion.

In one example, table lookup and computation 124 may include one or more functions for index selection 502 and one or more functions for result calculation 504. In additional or alternate examples, table lookup and computation 124 may include additional or alternate functions.

In one example, code 510 illustrates types of functions that may be implemented by table lookup and computation 124 for index selector 502 to select an index into the pre-computed interpolation point values in a constant table, illustrated as "tmp.t=x+511.5" and "index=(tmp.1>>29) & 0x7fffff". In one example, the addition of '511.5' to the input 'x' rotates the value so that the fractional portion of 'tmp' has 'floor((x−0.5)*32768.0)'. The '(tmp.1>>29)' right shifting and '0x7fffff' masking extract the fractional part of 'tmp' into the 'index' value for lookup.

In one example, code 510 also includes types of functions that may be implemented by table lookup and computation 124 for result calculation 504 to calculate a result based on the constant values looked up from the constant table using the index. In general, result calculator 504 may calculate a final result 'res' as 'res=$f(x_a)+x*f^1(x_a)$' with 'f' being the transcendental function and 'f1' being the first derivative at the interpolation point 'x_a' at index'. Alternatively, 'res' may be referred to as the sum of 'f_x+x*f_x1'. In particular, in the example in code 510 for the log f function, the result calculation 504 operation for the log f function is illustrated as 'res=log f_tbl.d[2*index]+x*log f_tbl.d[2*index+1]'. In the example, in computing the result the 'index' value is adjusted to an index number of the constant table generated for a truncated order 'm' of 2 in the example illustrated at reference numeral 410. A constant value pre-computed for the primary log f function at the indexed interpolation point "2*index" is accessed from cache from the 'f_x" column and a constant value pre-computed for the first derivative log f function at the indexed interpolation point "2*index+1" is accessed from cache from the 'f_x1" column. The result 'res' is the sum of the two looked up function value and the looked up derivative value, after scaling the looked up derivative value with the input argument.

In the example, by performing power series interpolation 122 to interpolate and truncate a power series expansion prior to generating constant table 132 and by combining scaling with generating a constant table of the values of interpolation points which are looked up by table lookup and computation 124 for calculating a result of a transcendental function, power series controller 120 may produce, in one example, a speedup of 1.5× or more may be achieved for a log f standalone latency test on chip 110.

Figure 6:
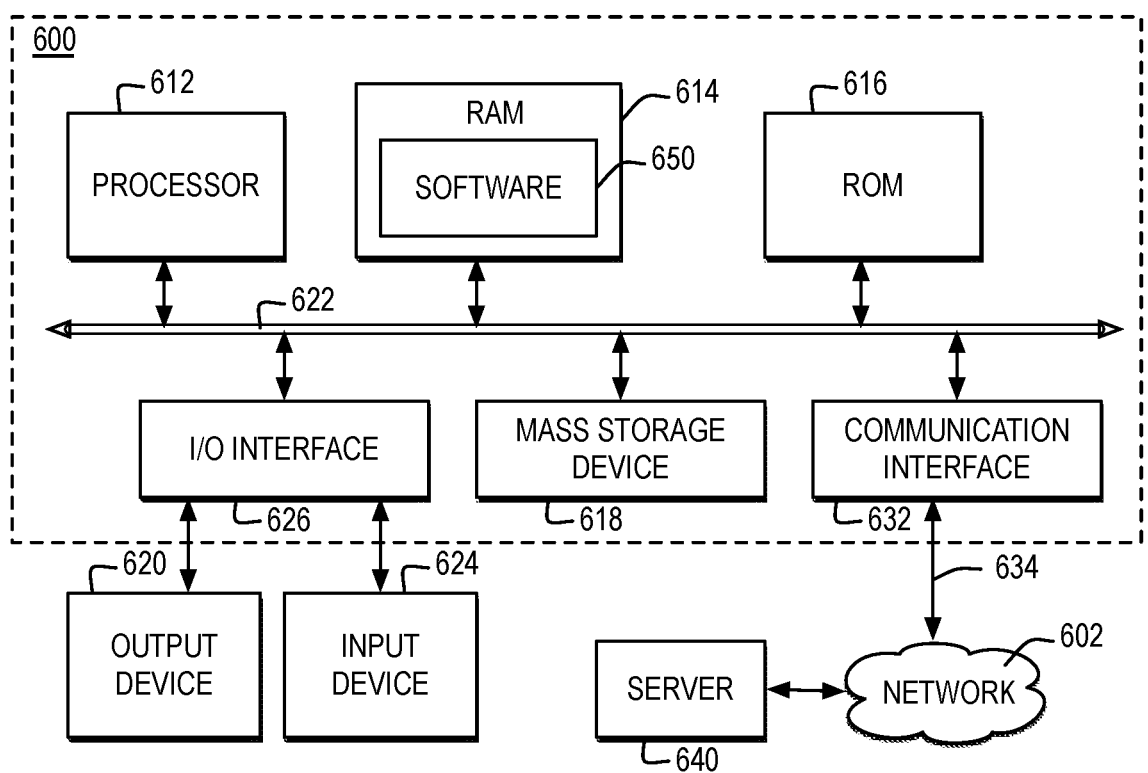
FIG. 6 illustrates one example of a block diagram of a computer system in which one embodiment of the invention may be implemented.

FIG. 6 illustrates a block diagram of one example of a computer system in which one embodiment of the invention may be implemented. The present invention may be performed in a variety of systems and combinations of systems, made up of functional components, such as the functional components described with reference to a computer system 600 and may be communicatively connected to a network, such as network 602.

Computer system 600 includes a bus 622 or other communication device for communicating information within computer system 600, and at least one hardware processing device, such as processor 612, coupled to bus 622 for processing information. Bus 622 preferably includes low-latency and higher latency paths that are connected by bridges and adapters and controlled within computer system 600 by multiple bus controllers. When implemented as a server or node, computer system 600 may include multiple processors designed to improve network servicing power.

Processor 612 may be at least one general-purpose processor that, during normal operation, processes data under the control of software 650, which may include at least one of application software, an operating system, middleware, and other code and computer executable programs accessible from a dynamic storage device such as random access memory (RAM) 614, a static storage device such as Read Only Memory (ROM) 616, a data storage device, such as mass storage device 618, or other data storage medium. Software 650 may include, but is not limited to, code, applications, protocols, interfaces, and processes for controlling one or more systems within a network including, but not limited to, an adapter, a switch, a server, a cluster system, and a grid environment.

Computer system 600 may communicate with a remote computer, such as server 640, or a remote client. In one example, server 640 may be connected to computer system 600 through any type of network, such as network 602, through a communication interface, such as network interface 632, or over a network link that may be connected, for example, to network 602.

In the example, multiple systems within a network environment may be communicatively connected via network 602, which is the medium used to provide communications links between various devices and computer systems communicatively connected. Network 602 may include permanent connections such as wire or fiber optics cables and temporary connections made through telephone connections and wireless transmission connections, for example, and may include routers, switches, gateways and other hardware to enable a communication channel between the systems connected via network 602. Network 602 may represent one or more of packet-switching based networks, telephony based networks, broadcast television networks, local area and wire area networks, public networks, and restricted networks.

Network 602 and the systems communicatively connected to computer 600 via network 602 may implement one or more layers of one or more types of network protocol stacks which may include one or more of a physical layer, a link layer, a network layer, a transport layer, a presentation layer, and an application layer. For example, network 602 may implement one or more of the Transmission Control Protocol/Internet Protocol (TCP/IP) protocol stack or an Open Systems Interconnection (OSI) protocol stack. In addition, for example, network 602 may represent the worldwide collection of networks and gateways that use the TCP/IP suite of protocols to communicate with one another. Network 602 may implement a secure HTTP protocol layer or other security protocol for securing communications between systems.

In the example, network interface 632 includes an adapter 634 for connecting computer system 600 to network 602 through a link and for communicatively connecting computer system 600 to server 640 or other computing systems via network 602. Although not depicted, network interface 632 may include additional software, such as device drivers, additional hardware and other controllers that enable communication. When implemented as a server, computer system 600 may include multiple communication interfaces accessible via multiple peripheral component interconnect (PCI) bus bridges connected to an input/output controller, for example. In this manner, computer system 600 allows connections to multiple clients via multiple separate ports and each port may also support multiple connections to multiple clients.

In one embodiment, the operations performed by processor 612 may control the operations of flowchart of FIGS. 7-10 and other operations described herein. Operations performed by processor 612 may be requested by software 650 or other code or the steps of one embodiment of the invention might be performed by specific hardware components that contain hardwired logic for performing the steps, or by any combination of programmed computer components and custom hardware components. In one embodiment, one or more components of computer system 600, or other components, which may be integrated into one or more components of computer system 600, may contain hardwired logic for performing the operations of flowcharts in FIGS. 7-10.

In addition, computer system 600 may include multiple peripheral components that facilitate input and output. These peripheral components are connected to multiple controllers, adapters, and expansion slots, such as input/output (I/O) interface 626, coupled to one of the multiple levels of bus 622. For example, input device 624 may include, for example, a microphone, a video capture device, an image scanning system, a keyboard, a mouse, or other input peripheral device, communicatively enabled on bus 622 via I/O interface 626 controlling inputs. In addition, for example, output device 620 communicatively enabled on bus 622 via I/O interface 626 for controlling outputs may include, for example, one or more graphical display devices, audio speakers, and tactile detectable output interfaces, but may also include other output interfaces. In alternate embodiments of the present invention, additional or alternate input and output peripheral components may be added.

With respect to FIG. 6, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing, device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly, on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Those of ordinary skill in the art will appreciate that the hardware depicted in FIG. 6 may vary. Furthermore, those of ordinary skill in the art will appreciate that the depicted example is not meant to imply architectural limitations with respect to the present invention.

Figure 7:
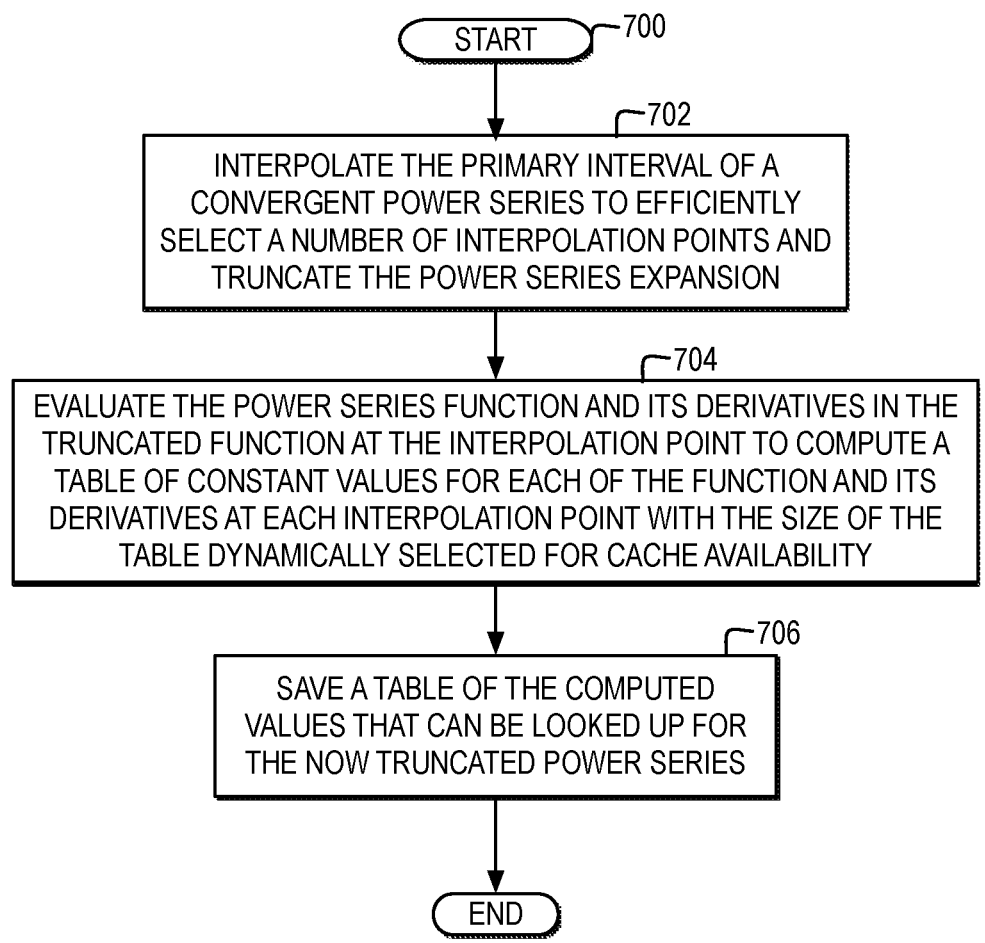
FIG. 7 illustrates a high level logic flowchart of a process and computer program for managing optimization of transcendental function operation on a chip by minimizing the operational latency of operations interpolated for transcendental functions with convergent power series.

FIG. 7 illustrates a high level logic flowchart of a process and computer program for managing optimization of transcendental function operation on a chip by minimizing the operational latency of operations interpolated for transcendental functions with convergent power series.

In one example, the process and computer program starts at block 700 and thereafter proceeds to block 702. Block 702 illustrates interpolating the primary interval of a convergent power series to efficiently select a number of interpolation points and truncate the power series expansion. Next, block 704 illustrates evaluating the function and its derivatives at the interpolation points to compute a table of constant values for each of the function at its derivatives at each interpolation point, with the size of the table dynamically selected for available cache. Thereafter, block 706 illustrates saving a table of the computed values that can be looked up for computing the now truncated power series expansion.

Figure 8:
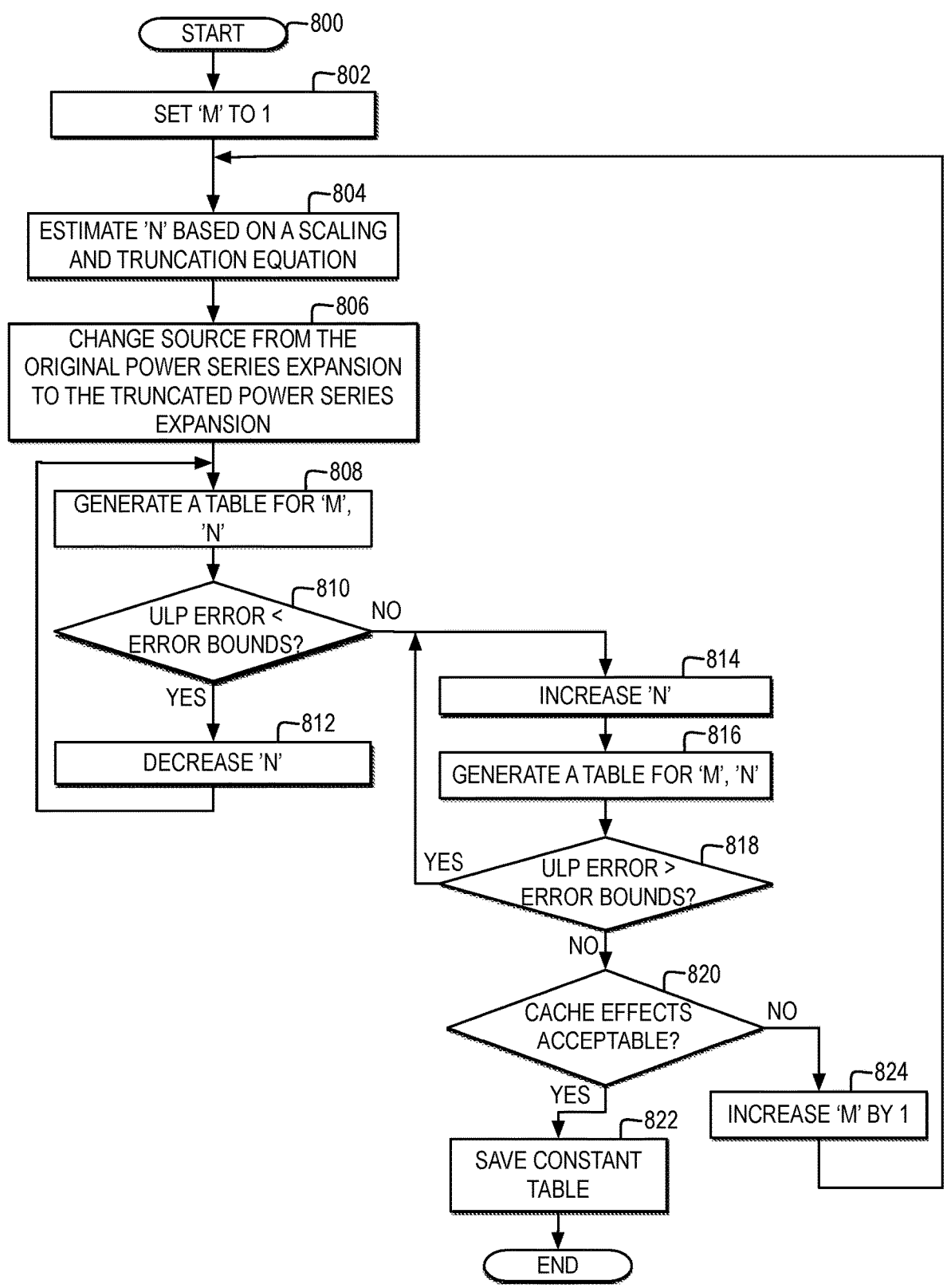
FIG. 8 illustrates a high level logic flowchart of a process and computer program for managing power series interpolation for generating a constant table optimized for a power series expansion replaced by a truncated power series expansion, where the constant table can be looked up for executing the truncated power series expansion.

FIG. 8 illustrates a high level logic flowchart of a process and computer program for managing power series interpolation for generating a constant table optimized for a power series expansion replaced by a truncated power series expansion, where the constant table can be looked up for executing the truncated power series expansion.

In one example, the process and computer program starts at block 800 and thereafter proceeds to block 802. Block 802 illustrates setting 'M' to 1, where 'M' is the truncated order of the power series expansion. Next, block 804 illustrates estimating 'N' based on a scaling and truncation equation, such as scaling and truncation equation 230, where 'N' is the number of interpolation points. Thereafter, block 806 illustrates changing a source from the original power series expansion to a truncated power series expansion, truncated by 'M'. Next, block 808 illustrates generating a table for 'M' and 'N' for the truncated power series expansion. Block 810 illustrates a determination whether the ULP error for the constant values in the generated table is less than the error bounds.

At block 810, if the ULP error is less than the error bounds, then the process passes to block 812. Block 812 illustrates decreasing 'N', and the process returns to block 808.

At block 810, if the ULP error for the generated table is not less than the error bounds, then the process passes to block 814. Block 814 illustrates increasing 'N'. Next, block 816 illustrates generating a table for 'M' and 'N' for the truncated power series expansion. Thereafter, block 818 illustrates a determination whether the ULP error for the generated table is greater than the error bounds. At block 818, if the ULP error for the generated table is not greater than the error bounds, then the process returns to block 814. Otherwise, at block 818, if the ULP error for the generated table is greater than the error bounds, then the process passes to block 820. Block 820 illustrates a determination whether the cache effects of the generated table of pre-computed constant values are acceptable, given the size of the generated table and the memory space available for the table in cache.

At block 820, if the cache effects of the generated table are not acceptable, then the process passes to block 824. Block 824 illustrates increasing 'M' by 1, and the process returns to block 804.

At block 820, if the cache effects of the generated table are acceptable, then the process passes to block 822. Block 822 illustrates saving the generated constant table, and the process ends.

Figure 9:
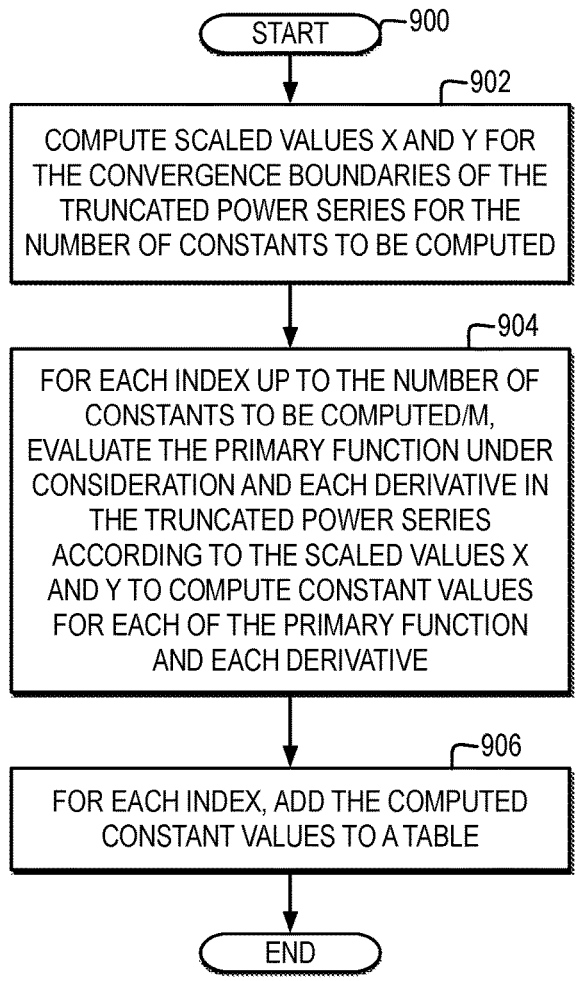
FIG. 9 illustrates a high level logic flowchart of a process and computer program for generating a compute table of interpolation point values for a truncated power series expansion for lookup during execution of the truncated power series expansion.

FIG. 9 illustrates a high level logic flowchart of a process and computer program for generating a compute table of interpolation point values for a truncated power series expansion for lookup during execution of the truncated power series expansion.

In one example, the process and computer program starts at block 900 and thereafter proceeds to block 902. Block 902 illustrates computing scaled values for X and Y for the convergence boundaries of the truncated power series for the number of constants to be computed. Next, block 904 illustrates, for each index up to a value of the total number of constants to be computed/M, evaluate the primary function under consideration and each derivative in the truncated power series according to the scaled values X and Y to compute constant values for each of the primary function and each derivative. Thereafter, block 906 illustrates, for each index, adding the computed constant values to a table, and the process ends.

Figure 10:
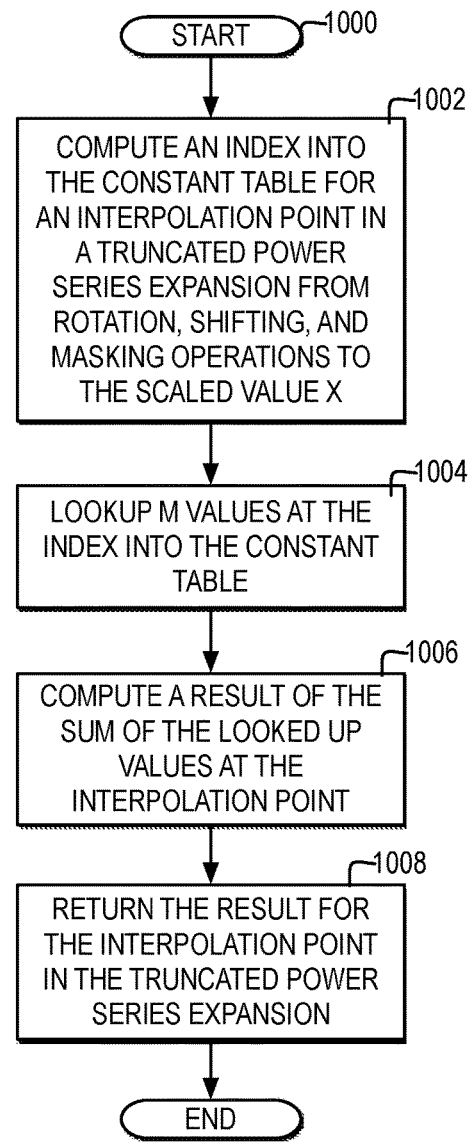
FIG. 10 illustrates a high level logic flowchart of a process and computer program product for looking up pre-computed constant values for interpolation points of a power series expansion from a constant table and computing a result of the constant values, for efficient computation of a transcendental function with a convergent power series expansion.

FIG. 10 illustrates a high level logic flowchart of a process and computer program product for looking up pre-computed constant values for interpolation points of a power series expansion from a constant table and computing a result of the constant values, for efficient computation of a transcendental function with a convergent power series expansion.

In one example, the process and computer program starts at block 1000 and thereafter proceeds to block 1002. Block 1002 illustrates computing an index into the constant table for an interpolation point in a truncated power series expansion from rotation, shifting, and masking operations to the scaled value X. Next, block 1004 illustrates looking up M values at the index into the constant table. Thereafter, block 1006 illustrates computing a result of the sum of the looked up values at the interpolation point. Next, block 1008 illustrates returning the result for the interpolation point in the truncated power series expansion, and the process ends.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification specify the presence of stated features, integers, steps, operations, elements, and/or components, but not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the one or more embodiments of the invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the invention has been particularly shown and described with reference to one or more embodiments, it will be understood by those skilled in the art that various changes in form and detail may be made therein without departing from the spirit and scope of the invention.

What is claimed is:

1. A method, comprising:
   interpolating, by a computer, a primary interval for convergence of at least one power series in a transcendental function while selecting a number of one or more interpolation points for a truncated expansion of the at least one power series by a selected order of truncation;
   evaluating; by the computer, a function and at least one derivative of the function of the truncated expansion of the selected order of truncation at the one or more interpolation points;
   comparing, by the computer, a first unit of last precision value of each separate value evaluated for the function and the at least one derivative at each of the one or more interpolation points;
   responsive to the first unit of last precision value being less than an error bounds:
      decreasing, by the computer, the number of the at one or more interpolations points; and
      reevaluating, by the computer, the function and the at least one derivative of the function of the truncated expansion of the selected order of truncation at the adjusted number of each of the one or more interpolation points;
   responsive to the first unit of last precision value not being less than the error bounds:
      increasing, by the computer, the number of the at one or more interpolations points;
      reevaluating, by the computer, the function and the at least one derivative of the function of the truncated expansion of the selected order of truncation at the adjusted number of each of the one or more interpolation points; and
      comparing, by the computer, a second unit of last precision value of each separate value evaluated for the function and the at least one derivative at each of the one or more interpolation points for the reevaluated function;
   responsive to the second unit of last precision being greater than the error bounds:
      increasing, by the computer, the number of the at one or more interpolations points;
      reevaluating, by the computer, the function and the at least one derivative of the function of the truncated expansion of the selected order of truncation at the adjusted number of each of the one or more interpolation points; and
      comparing, by the computer, a second unit of last precision value of each separate value evaluated for the function and the at least one derivative at each of the one or more interpolation points for the reevaluated function;
   responsive to the second unit of last precision not being greater than the error bound, determining, by the computer, whether a cache effect of a size of each separate value evaluated for the function and each of the least one derivative in the table;
   responsive to the cache effect being acceptable, saving, by the computer, each separate value evaluated for the function and each of the at least one derivative in a table in a cache, wherein the table is looked up for efficiently computing a result of the truncated expansion of the at least one power series; and
   responsive to the cache effect not being acceptable, increasing, by the computer, the selected order of truncation and estimating the number of one or more interpolation points to converge within the primary interval for the order of truncation at a specified number of fraction bits of precision.

2. The method according to claim 1, wherein interpolating; by a computer, a primary interval for convergence of at least one power series in a transcendental function while selecting a number of one or more interpolation points for a truncated expansion of the at least one power series by a selected order of truncation further comprises:
   setting; by the computer, the order of truncation to an initial value;
   estimating, by the computer, the number of one or more interpolation points; and
   changing, by the computer, a source of the transcendental function from the at least one power series to the truncated expansion of the at least one power series, wherein the truncated expansion comprises the order of truncation set to the initial value.

3. The method according to claim 2, wherein estimating, by the computer, the number of one or more interpolation points further comprises:

estimating, by the computer, the number of one or more interpolation points to converge within the primary interval for the order of truncation at a specified number of fraction bits of precision.

4. The method according to claim 1, further comprising:
responsive to saving the table, computing, by the computer, an index into the table for a particular interpolation point of the one or more interpolation points in a truncated expansion by rotating, shifting, and masking operations to a scaled convergent boundary value;
looking up, by the computer, at least two values at the index into the table;
computing, by the computer, a result of the sum of the looked up at least two values; and
returning, by the computer; the result for the particular interpolation point as the result of the transcendental function.

5. The method according to claim 1, further comprising:
scaling, by the computer, the primary interval for convergence to select a number of derivatives in the truncated order required to evaluate an error of the at least one power series within a selected value of a unit of last precision.

6. The method according to claim 1, further comprising:
selecting, by the computer, the number of one or more interpolation points and the order of truncation to minimize a total number of the at least one derivative of the function while increasing the number of one or more interpolation points to a value that is acceptable for a size of the table to fit within cache.

7. A computer system, comprising:
one or more processors coupled to one or more memories;
the processor operative to interpolate a primary interval for convergence of at least one power series in a transcendental function while selecting a number of one or more interpolation points for a truncated expansion of the at least one power series by a selected order of truncation;
the processor operative to evaluate a function and at least one derivative of the function of the truncated expansion of the selected order of truncation at the one or more interpolation points;
the processor operative to compare a first unit of last precision value of each separate value evaluated for the function and the at least one derivative at each of the one or more interpolation points;
the processor operative to, responsive to the first unit of last precision value being less than an error bounds:
decrease the number of the at one or more interpolations points; and
reevaluate the function and the at least one derivative of the function of the truncated expansion of the selected order of truncation at the adjusted number of each of the one or more interpolation points;
the processor operative to, responsive to the first unit of last precision value not being less than the error bounds:
increase the number of the at one or more interpolations points;
reevaluate the function and the at least one derivative of the function of the truncated expansion of the selected order of truncation at the adjusted number of each of the one or more interpolation points; and
compare a second unit of last precision value of each separate value evaluated for the function and the at least one derivative at each of the one or more interpolation points for the reevaluated function;

the processor operative to, responsive to the second unit of last precision being greater than the error bounds:
increase the number of the at one or more interpolations points;
reevaluate the function and the at least one derivative of the function of the truncated expansion of the selected order of truncation at the adjusted number of each of the one or more interpolation points; and
compare a second unit of last precision value of each separate value evaluated for the function and the at least one derivative at each of the one or more interpolation points for the reevaluated function;
the processor operative to, responsive to the second unit of last precision not being greater than the error bound, determine whether a cache effect of a size of each separate value evaluated for the function and each of the least one derivative in the table;
the processor operative to, responsive to the cache effect being acceptable, save each separate value evaluated for the function and each of the at least one derivative in a table in a cache, wherein the table is looked up for efficiently computing a result of the truncated expansion of the at least one power series; and
the processor operative to, responsive to the cache effect not being acceptable, increase the selected order of truncation and estimating the number of one or more interpolation points to converge within the primary interval for the order of truncation at a specified number of fraction bits of precision.

8. The computer system according to claim 7, wherein the processor operative to interpolate a primary interval for convergence of at least one power series in a transcendental function while selecting a number of one or more interpolation points for a truncated expansion of the at least one power series by a selected order of truncation further comprises:
the processor operative to set the order of truncation to an initial value;
the processor operative to estimate the number of one or more interpolation points; and
the processor operative to change a source of the transcendental function from the at least one power series to the truncated expansion of the at least one power series, wherein the truncated expansion comprises the order of truncation set to the initial value.

9. The computer system according to claim 8, wherein the processor operative to set estimate the number of one or more interpolation points further comprises:
the processor operative to estimate the number of one or more interpolation points to converge within the primary interval for the order of truncation at a specified number of fraction bits of precision.

10. The computer system according to claim 7, further comprising:
the processor operative; responsive to saving the table; to compute an index into the table for a particular interpolation point of the one or more interpolation points in a truncated expansion by rotating, shifting; and masking operations to a scaled convergent boundary value;
the processor operative to look up at least two values at the index into the table;
the processor operative to compute a result of the sum of the looked up at least two values; and
the processor operative to return the result for the particular interpolation point as the result of the transcendental function.

11. The computer system according to claim 7, further comprising:
the processor operative to scale the primary interval for convergence to select a number of derivatives in the truncated order required to evaluate an error of the at least one power series within a selected value of a unit of last precision.

12. The computer system according to claim 7, further comprising:
the processor operative to select the number of one or more interpolation points and the order of truncation to minimize a total number of the at least one derivative of the function while increasing the number of one or more interpolation points to a value that is acceptable for a size of the table to fit within cache.

13. A computer program product comprising one or more computer-readable storage devices and program instructions, stored on at least one of the one or more storage devices, the stored program instructions comprising:
program instructions to interpolate a primary interval for convergence of at least one power series in a transcendental function while selecting a number of one or more interpolation points for a truncated expansion of the at least one power series by a selected order of truncation;
program instructions to evaluate a function and at least one derivative of the function of the truncated expansion of the selected order of truncation at the one or more interpolation points;
program instructions to compare a first unit of last precision value of each separate value evaluated for the function and the at least one derivative at each of the one or more interpolation points;
program instructions to, responsive to the first unit of last precision value being less than an error bounds:
  decrease the number of the at one or more interpolations points; and
  reevaluate the function and the at least one derivative of the function of the truncated expansion of the selected order of truncation at the adjusted number of each of the one or more interpolation points;
program instructions to, responsive to the first unit of last precision value not being less than the error bounds:
  increase the number of the at one or more interpolations points;
  reevaluate the function and the at least one derivative of the function of the truncated expansion of the selected order of truncation at the adjusted number of each of the one or more interpolation points; and
  compare a second unit of last precision value of each separate value evaluated for the function and the at least one derivative at each of the one or more interpolation points for the reevaluated function;
program instructions to, responsive to the second unit of last precision being greater than the error bounds:
  increase the number of the at one or more interpolations points;
  reevaluate the function and the at least one derivative of the function of the truncated expansion of the selected order of truncation at the adjusted number of each of the one or more interpolation points; and
  compare a second unit of last precision value of each separate value evaluated for the function and the at least one derivative at each of the one or more interpolation points for the reevaluated function;
program instructions to, responsive to the second unit of last precision not being greater than the error bound; determine whether a cache effect of a size of each separate value evaluated for the function and each of the least one derivative in the table;
program instructions to, responsive to the cache effect being acceptable, save each separate value evaluated for the function and each of the at least one derivative in a table in a cache, wherein the table is looked up for efficiently computing a result of the truncated expansion of the at least one power series; and
program instructions to, responsive to the cache effect not being acceptable, increase the selected order of truncation and estimating the number of one or more interpolation points to converge within the primary interval for the order of truncation at a specified number of fraction bits of precision.

14. The computer program product according to claim 13, the stored program instructions further comprising:
program instructions to set the order of truncation to an initial value;
program instructions to estimate the number of one or more interpolation points; and
program instructions to change a source of the transcendental function from the at least one power series to the truncated expansion of the at least one power series, wherein the truncated expansion comprises the order of truncation set to the initial value.

15. The computer program product according to claim 14, the stored program instructions further comprising:
program instructions to estimate the number of one or more interpolation points to converge within the primary interval for the order of truncation at a specified number of fraction bits of precision.

16. The computer program product according to claim 14, the stored program instructions further comprising:
program instructions, responsive to saving the table, to compute an index into the table for a particular interpolation point of the one or more interpolation points in a truncated expansion by rotating, shifting, and masking operations to a scaled convergent boundary value;
program instructions to look up at least two values at the index into the table;
program instructions compute a result of the sum of the looked up at least two values; and
program instructions to return the result for the particular interpolation poi as the result of the transcendental function.

17. The computer program product according to claim 14, the stored program instructions further comprising:
program instructions to scale the primary interval for convergence to select a number of derivatives in the truncated order required to evaluate an error of the at least one power series within a selected value of a unit of last precision.

18. The computer program product according to claim 14, the stored program instructions further comprising:
program instructions to select the number of one or more interpolation points and the order of truncation to minimize a total number of the at least one derivative of the function while increasing the number of one or more interpolation points to a value that is acceptable for a size of the table to fit within cache.

* * * * *